(12) United States Patent
Drane

(10) Patent No.: US 11,010,515 B2
(45) Date of Patent: May 18, 2021

(54) IMPLEMENTING FIXED-POINT POLYNOMIALS IN HARDWARE LOGIC

(71) Applicant: Imagination Technologies Limited, Kings Langley (GB)

(72) Inventor: Theo Alan Drane, London (GB)

(73) Assignee: Imagination Technologies Limited, Kings Langley (GB)

( * ) Notice: Subject to any disclaimer, the term of this patent is extended or adjusted under 35 U.S.C. 154(b) by 1133 days.

(21) Appl. No.: 14/856,393

(22) Filed: Sep. 16, 2015

(65) Prior Publication Data

US 2016/0097808 A1 Apr. 7, 2016

(30) Foreign Application Priority Data

Oct. 1, 2014 (GB) ...................... 1417393

(51) Int. Cl.
*G06F 30/327* (2020.01)
(52) U.S. Cl.
CPC .................. *G06F 30/327* (2020.01)
(58) Field of Classification Search
None
See application file for complete search history.

(56) References Cited

U.S. PATENT DOCUMENTS

| | | | | |
|---|---|---|---|---|
| 5,046,038 A * | 9/1991 | Briggs | ................. | G06F 7/4917 708/654 |
| 6,560,623 B1 * | 5/2003 | Smith | ................. | G06F 7/49957 708/497 |
| 6,978,289 B1 | 12/2005 | Matula | | |
| 8,370,226 B1 * | 2/2013 | Bhatt | ................. | G06Q 40/12 705/30 |
| 8,443,029 B2 * | 5/2013 | Cowlishaw | ............. | G06F 7/483 708/495 |
| 2001/0007990 A1 * | 7/2001 | Chen | ................. | G06F 7/724 708/270 |
| 2001/0051966 A1 * | 12/2001 | Pelton | ................. | G06F 17/141 708/270 |

OTHER PUBLICATIONS

Milos D. Ercegovac, "A General Hardware-Oriented Method for Evaluation of Functions and Computations in a Digital Computer" pp. 667-680, IEE Transactions on Computers, vol. c-26, No. 7 (Year: 1977).*
Drane, "Lossy Polynomial Datapath Synthesis," Imperial College London, pp. 199-213, Published Sep. 19, 2014.

* cited by examiner

*Primary Examiner* — Michael D. Yaary
(74) *Attorney, Agent, or Firm* — Potomac Law Group, PLLC; Vincent M DeLuca

(57) ABSTRACT

A method implements fixed-point polynomials in hardware logic. In an embodiment the method comprises distributing a defined error bound for the whole polynomial between operators in a data-flow graph for the polynomial and optimizing each operator to satisfy the part of the error bound allocated to that operator. The distribution of errors between operators is updated in an iterative process until a stop condition (such as a maximum number of iterations) is reached.

19 Claims, 11 Drawing Sheets

IMPLEMENTING FIXED-POINT POLYNOMIALS IN HARDWARE LOGIC

BACKGROUND

As is known to those of skill in the art, a polynomial is a mathematical expression comprising one or more terms, each of which consists of a constant multiplied by one or more variables raised to a non-negative integer exponent (e.g. $a+bx+cx^2$, where a, b and c are the constants and x is the variable).

Polynomials are very common as they can be used to calculate a variety of values and/or model certain behavior. For example, a point $(a_1, a_2, a_3)$ 102 is determined to be on one side of a triangle 104 defined by three points (0, 0, 0), $(b_1, b_2, b_3)$, and $(c_1, c_2, c_3)$ as shown in FIG. 1a if equation (1) below is true:

$$a_1 b_2 c_3 - a_1 b_3 c_2 - a_2 b_1 c_3 + a_2 b_3 c_1 + a_3 b_1 c_2 - a_3 b_2 c_1 \geq 0 \quad (1)$$

In another example, a line passing through the point (0,0,0) and $(v_1, v_2, v_3)$ 106 is determined to pass through a sphere 108 defined by a radius r and centre $(c_1, c_2, c_3)$, as shown in FIG. 1b, if equation (2) is true:

$$(v_1 c_1 + v_2 c_2 + v_3 c_3)^2 - (v_1^2 + v_2^2 + v_3^2)(c_2^1 + c_2^2 + c_3^2 - r^2) \geq 0 \quad (2)$$

In further examples, polynomials may be used to implement filters, perform memory address calculations, perform binary to decimal conversion, etc. A variety of number and graphics formats have polynomial interpretations (e.g. floating-point formats, UNORM and SNORM graphics formats) and certain logical operations (e.g. inversion, XORing each bit of a with bit s) are also polynomial.

When a polynomial is evaluated in hardware it may be evaluated using fixed-point or floating point number representations. As is known to those skilled in the art a fixed-point number representation is a representation of a number that has a fixed number of digits after the radix point (e.g. decimal point or binary point). In contrast, a floating point number representation of a number is a representation of a number where the radix point is not fixed (i.e. it can "float"). In other words the radix point can be placed anywhere within the representation.

The embodiments described below are not limited to implementations which solve any or all of the disadvantages of known systems and method for implementing fixed-point polynomials.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Methods of implementing fixed-point polynomials in hardware logic are described. In an example embodiment the method comprises distributing a defined error bound for the whole polynomial between operators in a data-flow graph for the polynomial and optimizing each operator to satisfy the part of the error bound allocated to that operator. The distribution of errors between operators is updated in an iterative process until a stop condition (such as a maximum number of iterations) is reached.

An aspect provides an example method of generating an implementation of a fixed-point polynomial with rational coefficients in hardware logic that satisfies a defined error bound. The method receives the polynomial as a data-flow graph comprising one or more nodes. A node is either a sum-of-products operator or a constant division operator. An error bound is computed for each node in the data-flow graph based on the defined error bound for the polynomial. The method then optimizes a single summation array for each node using a truncation scheme and the error bound for the node. An updated error bound is calculated for each node in the data-flow graph and further optimizing is performed on the single summation array for each node using the truncation scheme and the updated error bound for the node. The calculating of updated error bounds redistributes error bounds between nodes to allow for synthesis of the fixed-point polynomial with a reduced physical size whilst satisfying the defined error bound.

A second aspect provides a computer readable storage medium having encoded thereon computer readable program code for performing the method as described above.

A third aspect provides an apparatus configured to perform lossy synthesis of a fixed-point polynomial with rational coefficients and generate an implementation of the fixed-point polynomial in RTL, the apparatus comprising: a processor; and a memory comprising computer executable instructions which, when executed, cause the processor to: receive the polynomial as a data-flow graph comprising one or more nodes, wherein a node is either a sum-of-products operator or a constant division operator; compute an error bound for each node in the data-flow graph based on the defined error bound for the polynomial; optimize a single summation array for each node using a truncation scheme and the error bound for the node; calculate an updated error bound for each node in the data-flow graph; and further optimize the single summation array for each node using the truncation scheme and the updated error bound for the node. The calculating of updated error bounds redistributes error bounds between nodes to allow for synthesis of the fixed-point polynomial with a reduced physical size whilst satisfying the defined error bound.

A fourth aspect provides an apparatus configured to compare two or more array summations when implemented in hardware logic, the apparatus comprising: a processor; and a memory comprising computer executable instructions which, when executed, cause the processor to: receive RTL data describing the two or more array summations; and calculating, for each array summation, a cost function using:

$$\text{area(array}(h, w, pp)) \approx 7pp\left(1 - \left(\frac{2}{3}\right)^f\right) + \frac{w}{2}(3\lceil \log_2 w \rceil + 11)$$

$$\text{where } f = \left\lceil \frac{\log_2 h - 1}{\log_2 3 - 1} \right\rceil$$

where w is a width of the array, h is a height of the array and pp is a number of bits in the array. The cost functions calculated for each array summation provide for several candidate RTL implementations to be compared and an RTL implementation with an optimal cost function to be selected for implementation in hardware.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

This acknowledges that firmware and software can be separately used and valuable. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1A:
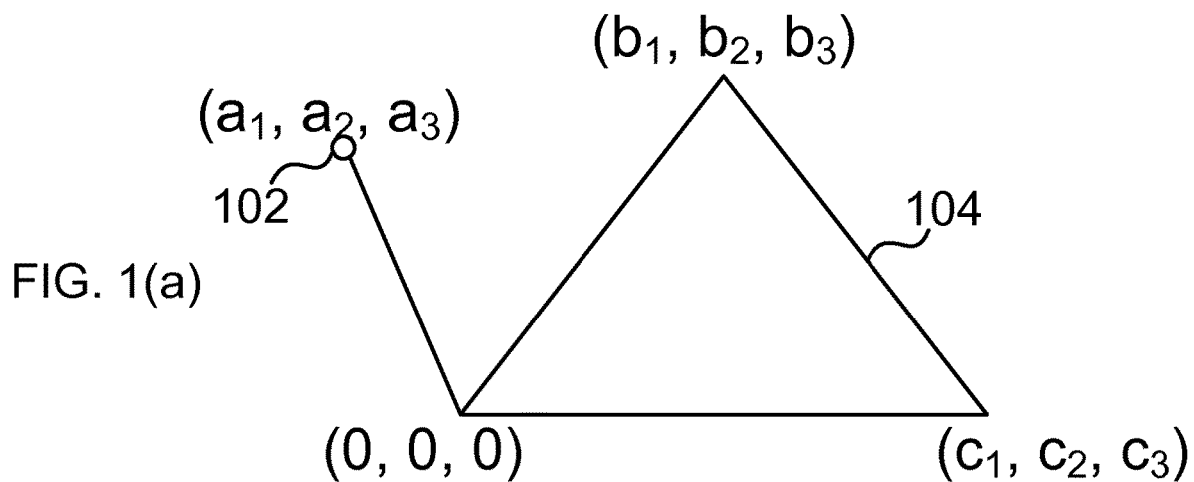
FIG. 1a is a schematic diagram of a triangle defined by three three-dimensional points.
Figure 1B:
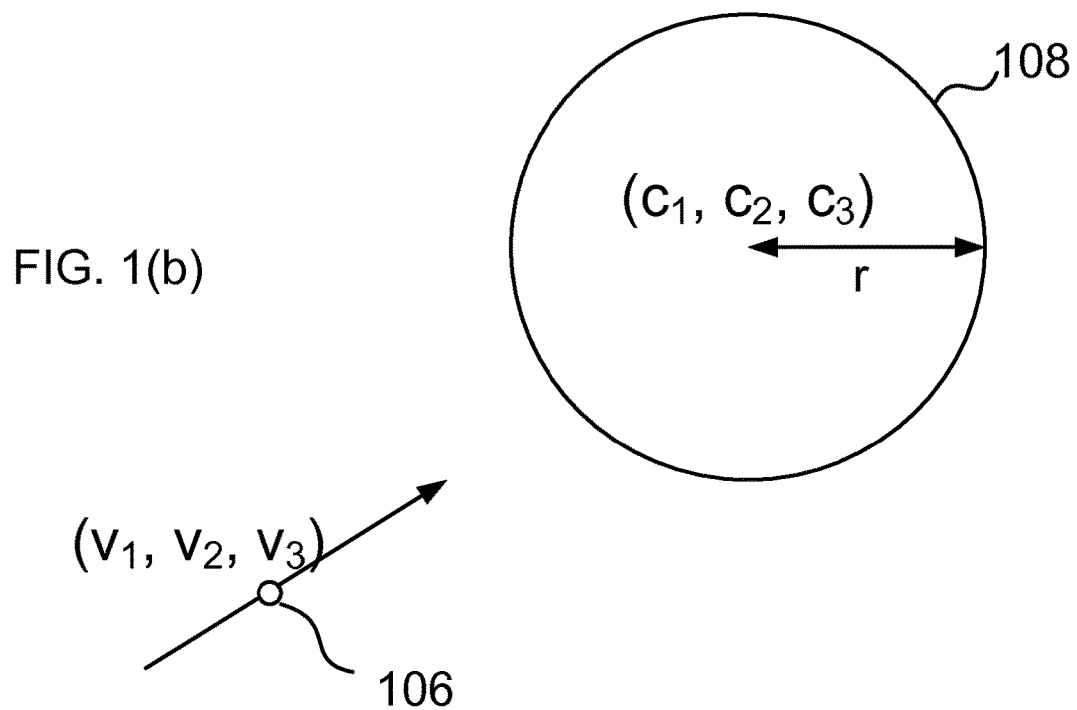
FIG. 1b is a schematic diagram of a circle defined by a radius and a three-dimensional centre point.

Common reference numerals are used throughout the figures to indicate similar features.

DETAILED DESCRIPTION

Embodiments of the present invention are described below by way of example only. These examples represent various ways of putting the invention into practice that are currently known to the Applicant although they are not the only ways in which this could be achieved. The description sets forth the functions of the examples and the sequence of steps for constructing and operating the examples. However, the same or equivalent functions and sequences may be accomplished by different examples.

Described herein are methods for implementing fixed-point polynomials in hardware logic which reduce resource usage (e.g. area of hardware logic that is required) whilst providing a guaranteed bounded error. A method of comparing the efficiency of multiple candidate architectures is also described. In the methods described, the polynomials are not evaluated to infinite precision but instead the methods enable exploitation of a user defined maximum absolute error and so may be described as lossy. As described in detail below, the methods described herein distribute the user defined maximum absolute error (which may also be referred to as the allowable error) between the operators in a data-flow graph (DFG) which represents the polynomial to reduce/minimize implementation cost whilst guaranteeing that the user defined maximum absolute error is not exceeded. The methods generate a hardware logic design at a register transfer level (RTL). Logic synthesis may then be used to transition from RTL to gate level to produce a gate level description which can then be laid out and implemented in silicon. In contrast to logic synthesis, the process of interpreting a system level model to produce a RTL description is referred to as high-level synthesis (HLS) and the methods described herein may be implemented in a synthesizer.

As described above, lossy synthesis is a method of synthesis (e.g. HLS) where the result is not bit identical to the input. In the methods described herein, the user specifies and controls the error and the lossy synthesizer exploits the error freedom to optimize hardware area, speed and/or power. Exploiting the error freedom comprises adjusting particular parameters within the circuits to be created. There are a number of approaches to lossy synthesis which have been proposed, including word-length optimization, imprecise operators and gate level imprecision. Word-level optimization involves choosing the precision for all internal variables whilst maintaining acceptable global (i.e. overall) error. The word-length (i.e. number of bits used to represent an internal variable) is dependent upon the range and precision of the data the variable must hold, as well as the number format. Choosing the best precision for all internal variables has, however, been shown to be NP-hard in general. Imprecise operators are operators (such as adders) which do not necessarily return the correct answer, but return an answer which is correct within a defined accuracy (e.g. rounded using a rounding scheme). Various imprecise adder and multiplier architectures have been proposed and some are described below; however determining how to use these imprecise components to optimize certain hardware properties while maintaining an acceptable level of total output error for an entire polynomial is complex. Gate level imprecision involves removing logic gates from a circuit whilst still maintaining some level of quality of the result.

Figure 2:
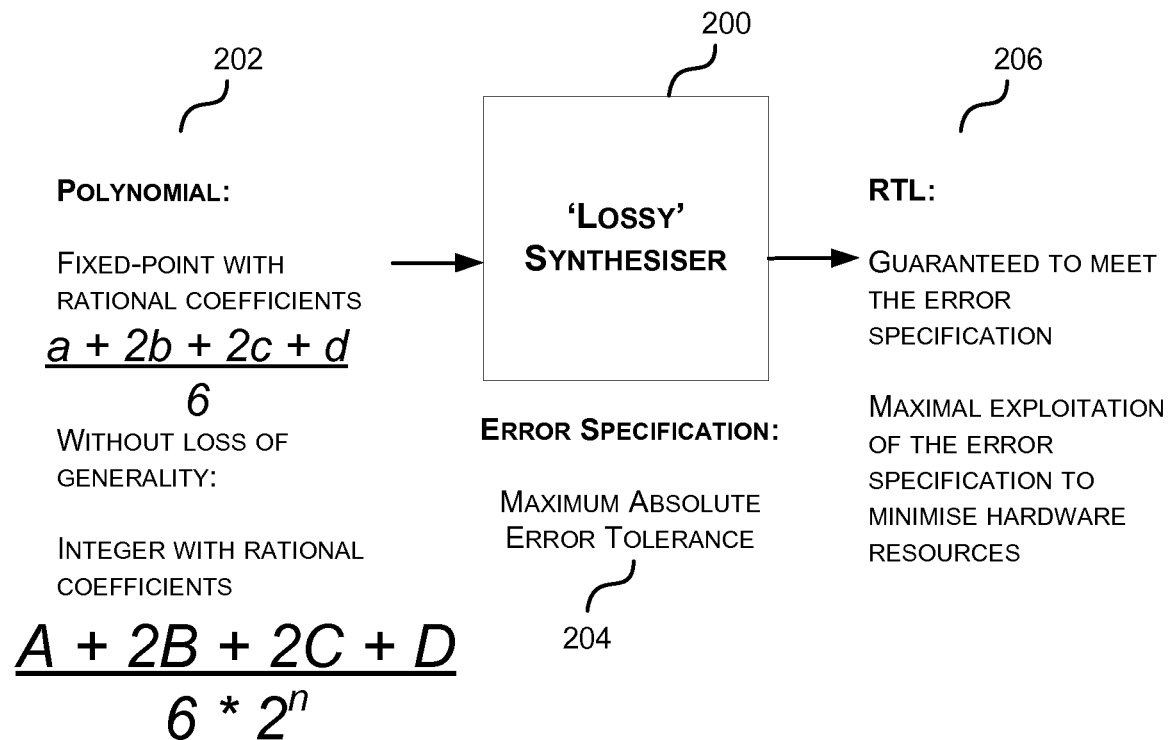
FIG. 2 is an example schematic diagram of a lossy synthesizer.

The methods described herein are implemented in a lossy synthesizer 200 of the form shown in FIG. 2. This lossy synthesizer 200 takes as input 202 a polynomial with rational coefficients and fixed-point inputs and outputs. An error specification 204 is also provided which provides a user bounded error (i.e. a maximum absolute error tolerance). The output 206 of the synthesizer 200 is RTL that is guaranteed to meet the error specification 204 and is suitable for datapath logic synthesis. A typical user requirement is that the result should be correct to the unit in the last place and this can be translated into an absolute error bound.

Figure 3:
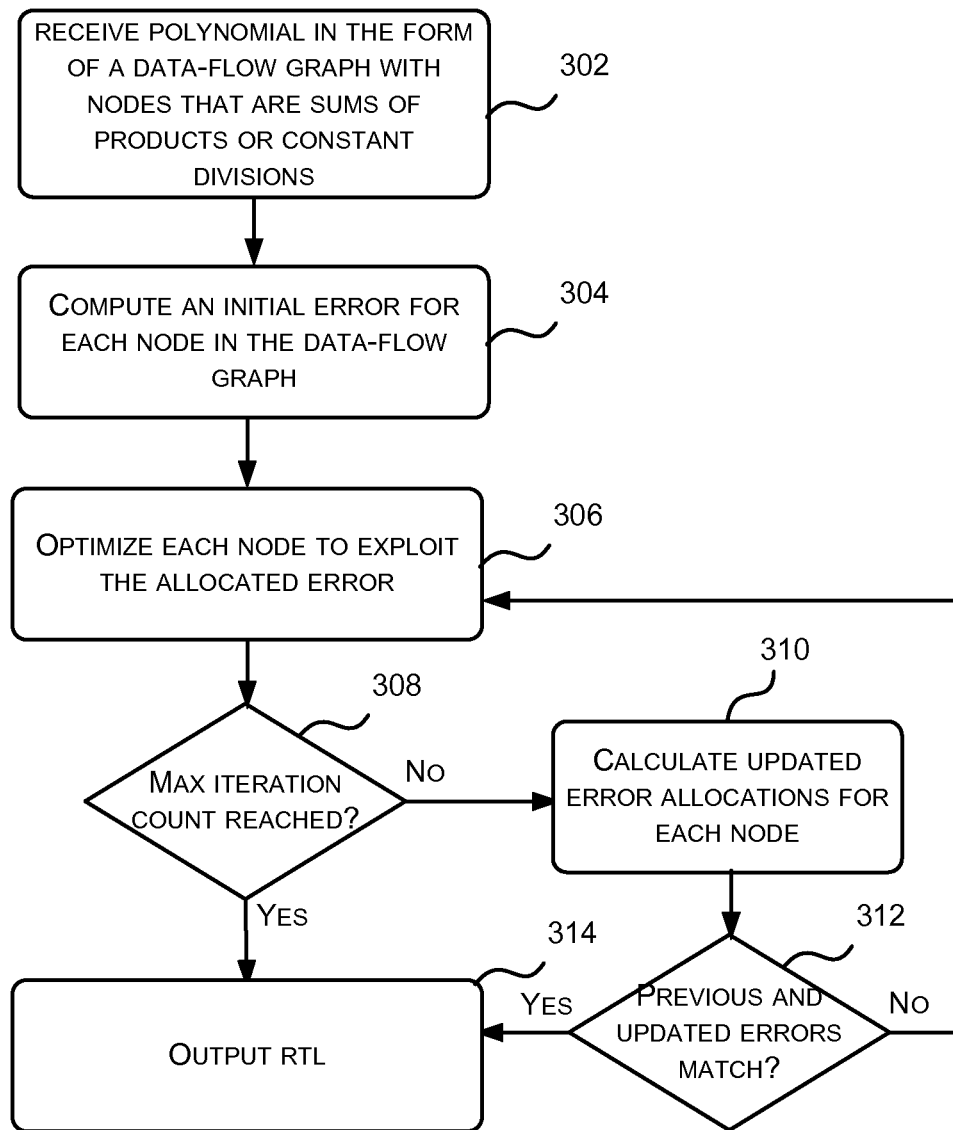
FIG. 3 is an example flow diagram of an example method of operation of the lossy synthesizer shown in FIG. 2.

FIG. 3 is a flow diagram of an example method of operation of the lossy synthesizer 200. As described above, an input 202 to the lossy synthesizer is a fixed-point polynomial with rational coefficients, p, for example:

$$p = \frac{a + 2b + 2c + d}{6}$$

Without loss of generality, the polynomial may be written as a polynomial with integer constants and rational coefficients, for example of the following form for an appropriate value of n:

$$p = \frac{A + 2B + 2C + D}{6 * 2^n}$$

Figure 4:
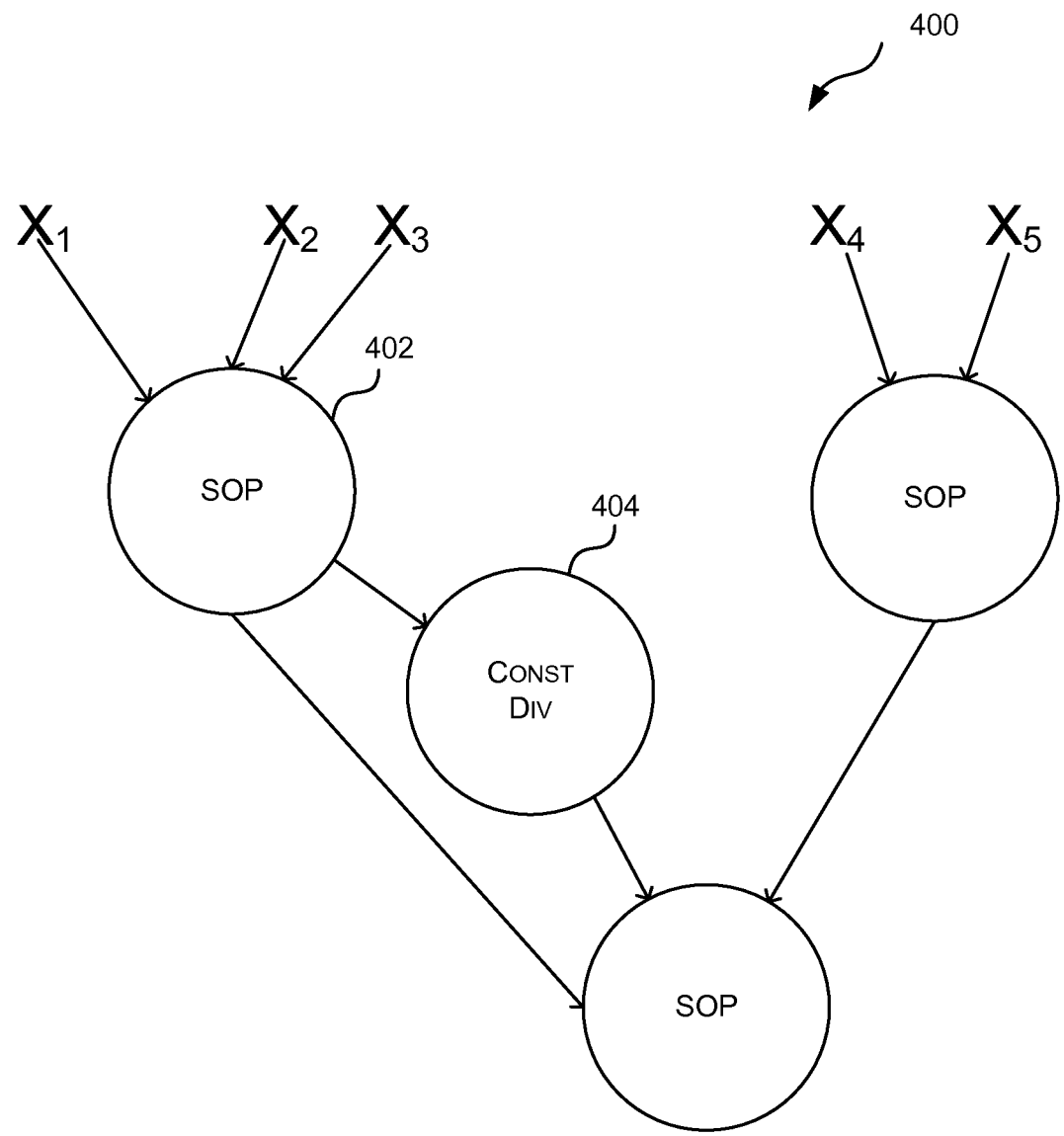
FIG. 4 shows an example data-flow graph.

As shown in FIG. 3, the polynomial, p, that is input to the lossy synthesizer 200, is represented in FIG. 4 as a DFG 400 with nodes that are either arithmetic sum-of-products (SOPs) 402 or constant division operators 404 (block 302). In the following description the terms 'node' and 'operator' are used interchangeably when referring to the DFG. Assuming that the input polynomial is written in a form that has integer inputs, then there are a myriad of ways that the polynomial can be written in terms of integer SOPs and constant divisions. Moreover, such an expression can always be created (e.g. $x^3$ may instead be written as $x \times x^2$). The DFG which is received by the lossy synthesizer (in block 302) may comprise operators which are all SOP operators or all constant division operators or may comprise a combination of one or more SOP operators and one or more constant division operators.

An SOP has the form:

$$AB \pm CD \pm E \ldots$$

and includes multipliers, squarers (e.g. $x^2$), constant multipliers and sets of additions. A constant division has the form:

$$x/d$$

where d is a constant. It has been shown that this division can be replaced by a single multiply-add instruction:

$$x/d \approx \lfloor (ax+b)/2^k \rfloor$$

for suitable values of a, b and k.

Having received the polynomial in the form of a DFG (in block 302), the task of the lossy synthesizer is to determine how to best distribute the allowed error 204 amongst the nodes (i.e. amongst the SOPs 402 and constant division operators 404). Each of the constant division operators 404 will introduce an error and each of the SOPs 402 may introduce an error and it is the cumulative effect of these individual operator errors which must not exceed the specified allowed error 204. In the method described herein, the goal is to remove the greatest number of partial product bits as ultimately the number and configuration of the partial products determines the characteristics of the cost of implementation of the polynomial. This is implemented in an iterative process (as shown in FIG. 3 by the arrow from block 312 to block 306) which starts by allocating an initial error to each node in the DFG (block 304) and then iteratively improves the distribution of errors between nodes (in blocks 306 and 310). The iterative loop (comprising blocks 306 and 310) terminates either when the maximum iteration count (or maximum runtime) is reached ('Yes' in block 308, e.g. at 100 iterations) or when the newly calculated updated errors (calculated in block 310) are the same as the previously used errors for each node ('Yes' in block 312). The maximum iteration count (or alternatively a maximum runtime which may be used instead in block 308) may be user specified and in some examples may not be used (e.g. block 308 may be omitted such that block 306 is followed by block 310). An example of way in which initial errors are computed (in block 304) and optimized (in block 306) is described in detail below for both a general case and for polynomials with specific characteristics (e.g. which enable simplification of the method used).

If $e_i$ is the maximum absolute error permitted in the ith operator (i.e. the ith node in the DFG) and $R_i(e)$ is the number of partial product bits removed in operator i due to exploiting the error freedom in all operators with bounds defined by the elements of e (where e is the vector of elements $e_i$), the total number of partial product bits removed (in block 306) is:

$$\sum_i R_i(e)$$

If $\hat{p}(x, \varepsilon)$ is the actual value of the implementation of polynomial p(x) which introduces an actual error $\varepsilon_i$ at node i (so $|\varepsilon_i| \le e_i$), then the absolute error requirement is, for a user defined bound (i.e. maximum absolute error tolerance) η:

$$|p(x) - \hat{p}(x,\varepsilon)| \le \eta$$

Expanding the left hand side with respect to s means that for some coefficients c(x) this condition can be written as follows:

$$\left| \sum_\alpha c_\alpha(x) \varepsilon^\alpha \right| \le \eta$$

where $c_\alpha(x)$ are particular polynomials in x and $\varepsilon^\alpha = \varepsilon_1^{\alpha_1} \varepsilon_2^{\alpha_2} \ldots$ and so the summation is performed over the various values of vector elements of α.

A bound on the left hand side is:

$$\left| \sum_\alpha c_\alpha(x) \varepsilon^\alpha \right| \le \sum_\alpha \left( \max_x |c_\alpha(x)| \right) e^\alpha$$

where e is the vector of allocated error limits for each node. For example, if:

$$p(x) = x^2 y^2$$

and $$\hat{p}(x,e) = (x^2 + e_1)(y^2 + e_2) + e_3$$

then $$p(x) - \hat{p}(x, e) = x^2 y^2 - (x^2 + e_1)(y^2 + e_2) - e_3$$
$$= -x^2 e_2 - y^2 e_1 - e_1 e_2 - e_3$$
$$= (-x^2) e_1^0 e_2^1 e_3^0 + (-y^2) e_1^1 e_2^0 e_3^0 +$$
$$(-1) e_1^1 e_2^1 e_3^0 + (-1) e_1^0 e_2^0 e_3^1$$

It can be seen that each term is of the form:

$$c_{\alpha_1, \alpha_2, \alpha_3}(x) e_1^{\alpha_1} e_2^{\alpha_2} e_3^{\alpha_3}$$

which can be written as:

$$c_\alpha(x) e^\alpha$$

so $c_\alpha(x)$ is a polynomial in x and a term in $p(x)$–$p(x, e)$ and $e^\alpha = e_1^{\alpha_1} e_2^{\alpha_2} e_3^{\alpha_3}$ is the error bound associated with that term which may be formed from one or more of the absolute maximum errors (or error bounds) for each node in the DFG ($e_1$, $e_2$, $e_3$ in this example) and $\alpha$ is a vector of integers.

So a sufficient, but potentially non necessary (i.e. potentially overly restrictive), condition for the scheme to meet the user defined absolute error requirement is:

$$\sum_\alpha \lambda_\alpha e^\alpha \le \eta$$

where $\lambda_\alpha$ is defined as:

$$\lambda_\alpha = \max_x |c_\alpha(x)|$$

The following optimization problem may then be posed, which maximizes the number of partial product bits removed with respect to the maximum absolute errors introduced at each node:

$$\max \sum_i R_i(e)$$

$$\text{subject to } \sum_\alpha \lambda_\alpha e^\alpha \le \eta$$

The maximum partial product removal will be achieved by fully utilizing the error freedom, so the constraint can be set as equality:

$$\max \sum_i R_i(e)$$

$$\text{subject to } \sum_\alpha \lambda_\alpha e^\alpha = \eta$$

This can be solved by creating the Lagrangian using a Lagrange multiplier T:

$$L = \sum_i R_i(e) + T\left(\sum_\alpha \lambda_\alpha e^\alpha - \eta\right)$$

Turning points of L are potential optimal solutions to the optimization problem, taking partial derivatives with respect to $e_j$ (i.e. the error limit for a particular node j) gives rise to the following equation:

$$\sum_i \frac{\partial R_i}{\partial e_j} + T \sum_\alpha \lambda_\alpha \frac{\partial e^\alpha}{\partial e_j} = 0$$

So an extremum of the original optimization occurs when:

$$\sum_i \frac{\partial R_i}{\partial e_j} \propto \sum_\alpha \lambda_\alpha \frac{\partial e^\alpha}{\partial e_j} \quad (3)$$

The term $$\frac{\partial R_i}{\partial e_j}$$

in equation (3) above depends on the current state of all of the values of e, i.e. the current allocated allowed errors at each of the nodes (e.g. as set initially in block 304 and updated in block 310). These values can provide guidance in which direction to move the values of e (e.g. in block 310 of FIG. 3), but as shown in FIG. 3, a starting state must first be set (e.g. in block 304).

A starting state may be computed (in block 304) in any way. In an example, a starting state may be computed by assuming that, in the absence of any knowledge of $R_i$ (i.e. the number of partial product bits removed at another node i), $e_j$ (the allocated error limit at node j) only affects $R_j$ (i.e. the number of partial product bits removed at that node j) and that $R_j$ is proportional to log $e_j$ (log $e_j$ will be proportional to the number of partial product columns that could be truncated when exploiting the error $e_j$). Under this assumption, the following holds:

$$\frac{\partial R_i}{\partial e_j} = 0 \text{ if } i \ne j$$

$$\frac{\partial R_j}{\partial e_j} \propto \frac{1}{e_j}$$

So a potential starting point for use in the iterative method of FIG. 3 (i.e. for use in block 304) would be using values of $e_i$ which satisfy the following equations for some constant T:

$$\sum_\alpha \lambda_\alpha e_j \frac{\partial e^\alpha}{\partial e_j} = T \text{ for all } j \quad (4a)$$

$$\sum_\alpha \lambda_\alpha e^\alpha = \eta \quad (4b)$$

Which can alternatively be written as, where $(\lambda, e) = \sum_\alpha \lambda_\alpha e^\alpha$:

$$e_j \frac{\partial q}{\partial e_j} = T \text{ for all } j \quad (4a')$$

$$q(\lambda, e) = \eta \quad (4b')$$

Having established starting values for the errors allocated to each node in the DFG using equations (4a) and (4b) or (4a') and (4b') above or an alternative technique, each node i is optimized to exploit the allocated error $e_i$ (block 306). There are a number of different ways in which this optimization may be performed. In many examples, the implementation of a node uses a single summation array (e.g. for the SOP or constant division operation) where all partial product bits are summed in parallel. An example of such a single summation array 500 is shown in FIG. 5 for an example SOP:

$$x_1y_1+x_2y_2+x_3y_3$$

Figure 5:
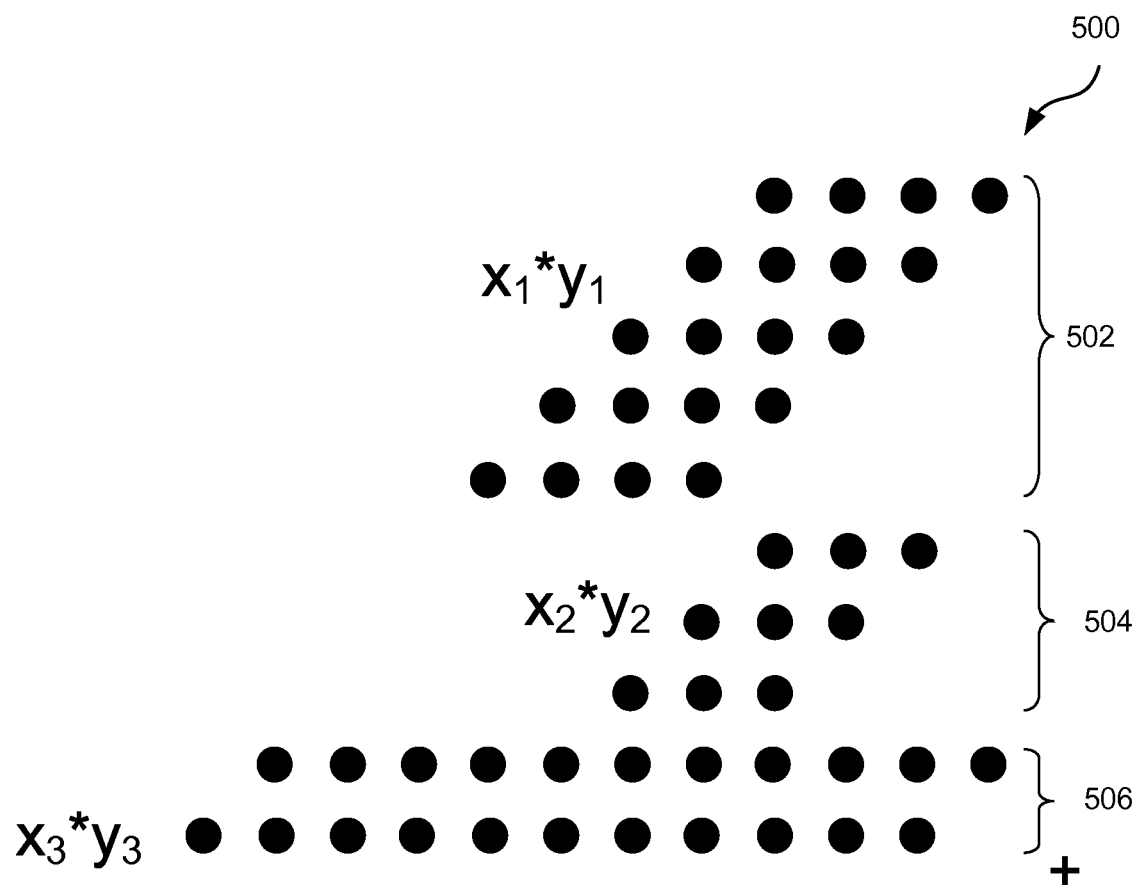
FIG. 5 shows an example summation array for a sum-of-products operator.

As shown in FIG. 5, the summation array 500 comprises a first group of partial product bits 502 which correspond to the term $x_1y_1$, a second group of partial product bits 504 which correspond to the term $x_2y_2$ and a third group of partial product bits 506 which correspond to the term $x_3y_3$.

Standard reduction techniques can be applied to the single summation array 500 and internal products (e.g. $x_1y_1$ or $x_2y_2$ or $x_3y_3$) will not exist during the reduction. By using a single summation array, the area which is used when implementing the node is reduced significantly (e.g. by 10-20% for a given SOP implementation). A single summation array 500 may alternatively be referred to as a binary array.

Figure 6:
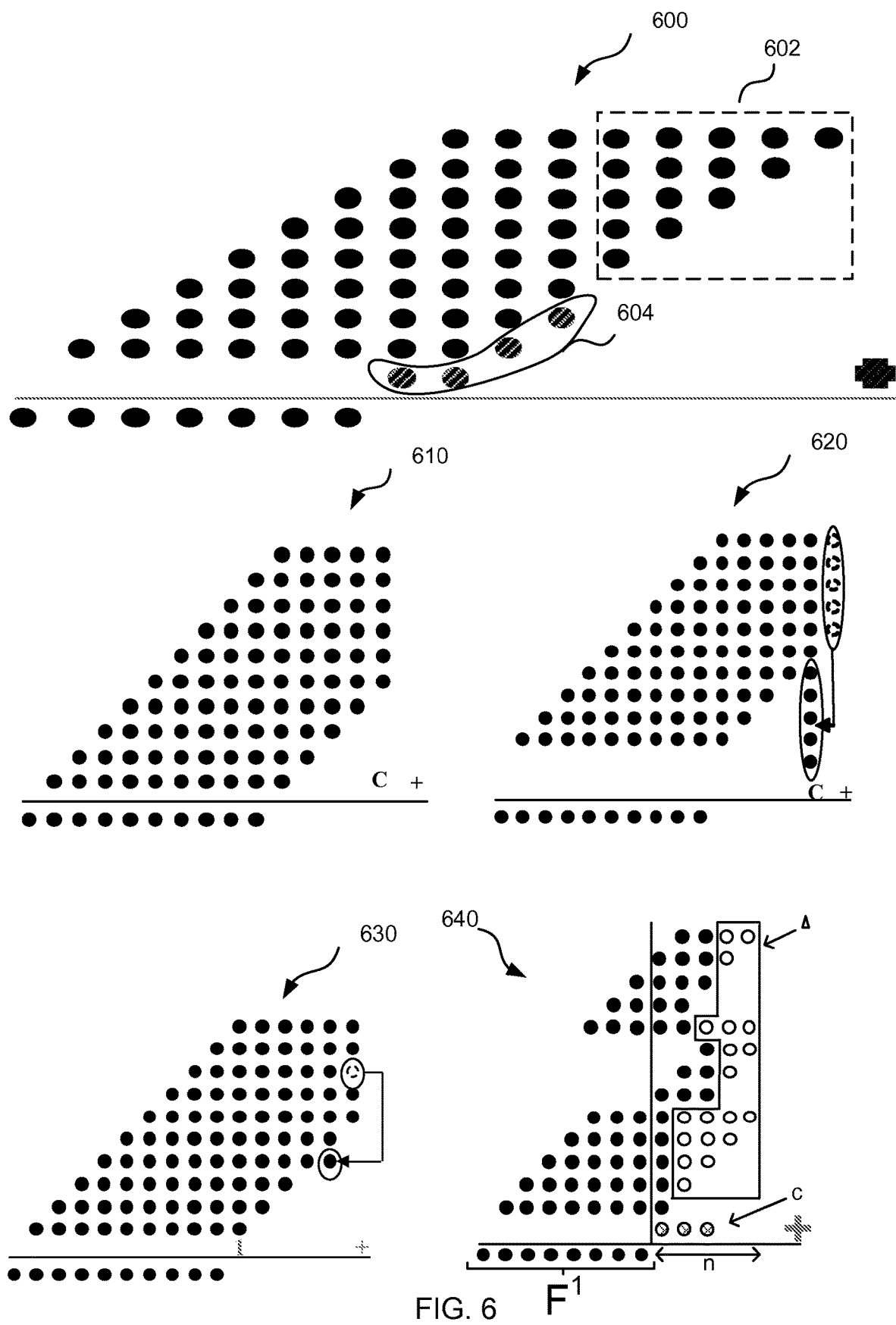
FIG. 6 shows examples of array truncation schemes.

In various examples, the optimization (in block 306) uses a truncation scheme which exhibits faithful rounding and which is applied to the single summation array. These truncation schemes use the principle that a faithfully rounded result can be achieved more efficiently (i.e. in less area of hardware logic) by removing some of the partial product bits in an array and performing some form of compensation for those removed bits, such as by adding a constant. This is shown graphically in FIG. 6 which shows a binary array 600 in which some of the least significant columns 602 are discarded and a constant 604 is added to compensate for the loss. Four particular truncation schemes are also shown graphically in FIG. 6: constant correction truncation (CCT) 610, variable correction truncation (VCT) 620, least mean square (LMS) 630 and a faithful rounding machine (FRator) 640. When using any of these schemes, the parameters used when removing bits and adding a constant (denoted C) must be selected to ensure faithful rounding. The first three of these schemes (CCT, VCT and LMS) work only when the operation is multiplication. The FRator truncation scheme works in any situation where there is a binary array.

Figure 7:
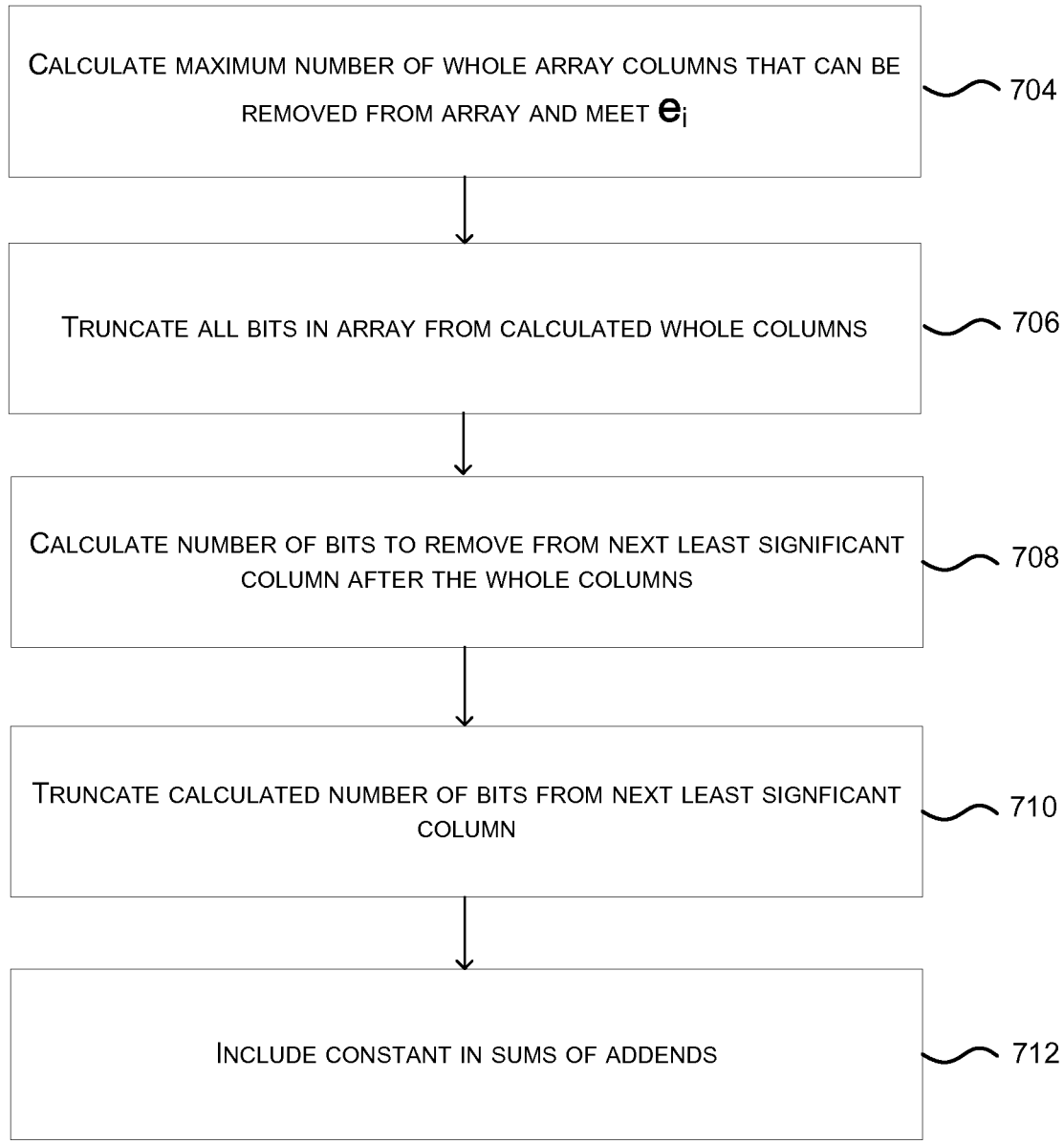
FIG. 7 is a flow diagram of an example truncation scheme which is referred to herein as 'FRator'.
Figure 8:
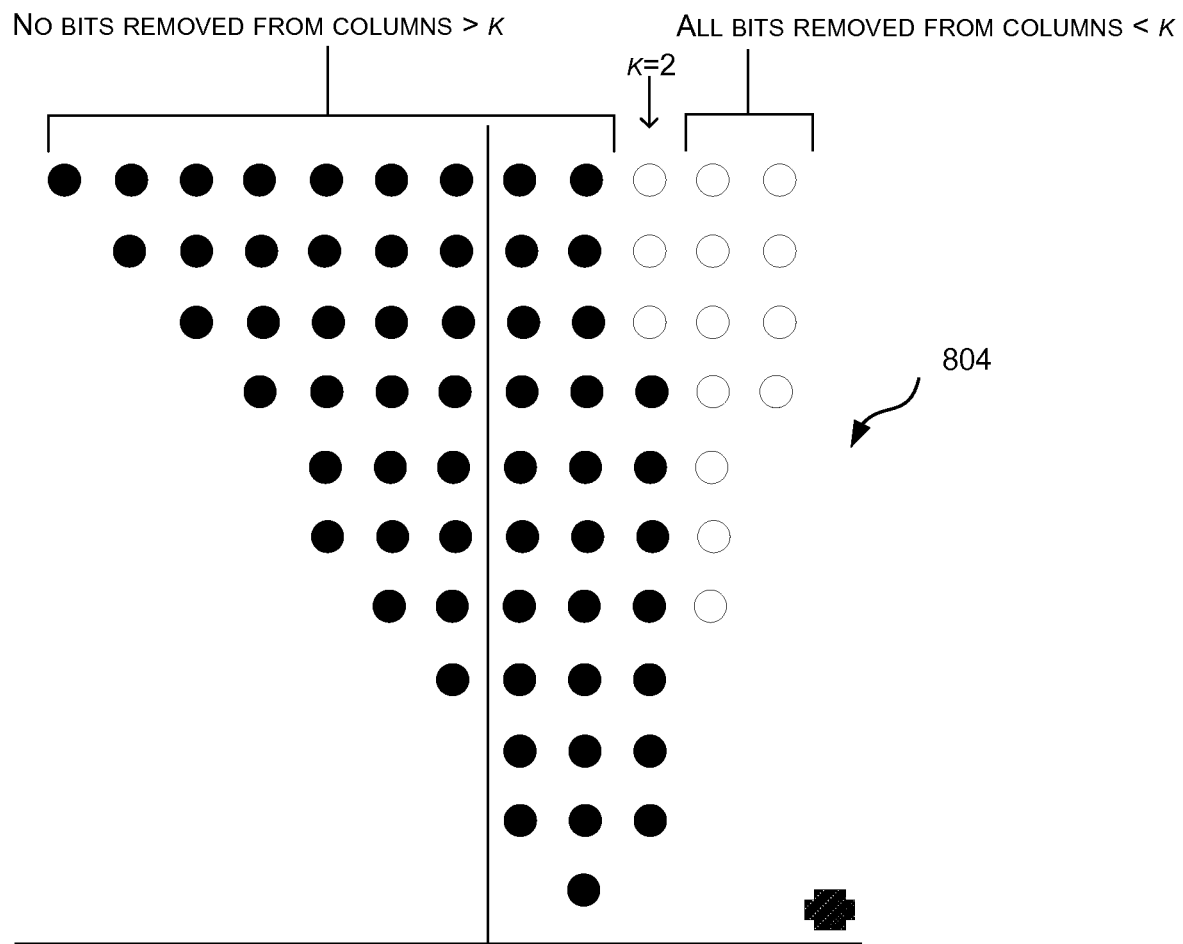
FIG. 8 is a graphical representation of the truncation scheme of FIG. 7.

In various examples, the FRator truncation scheme 640 (which is described in US Patent Application publication number US2013/0346927) is used. FRator, as described in the US Patent Application is a faithful rounding technique which removes the maximum number of bits such that the result is faithfully rounded. However, when used to optimize a node in a DFG (in block 306 of FIG. 3), it is modified so that it removes the maximum number of bits without exceeding the allocated error for that node (and hence generates an updated single summation array). As in other truncation schemes, a constant is added to compensate for the bits that have been removed. In the graphical representation 640 in FIG. 6, the bits which are removed are shown as empty circles and denoted $\Delta$ and the bits which are added as compensation (and form constant C) are shown as circles with striped shading. This truncation scheme can be described in more detail with reference to FIGS. 7 and 8. FIG. 7 is a flow diagram of the technique and FIG. 8 shows the technique graphically.

As shown in FIG. 7, the method comprises calculating the maximum number of entire columns that can be removed from the summation array (for the particular node i in the DFG) whilst not exceeding the error $e_i$ allocated to that node (block 704) and then removing all the bits in those identified columns (block 706). The maximum number of entire columns that can be removed can be calculated (in block 704) using a parameter k which is the largest number of complete (i.e. whole) least significant columns which can be removed from the summation array such that the allocated error is not exceeded. This may be written as:

$$k = \max(r) \text{ such that } \sum_{s=0}^{r-1} h_s 2^s < e_i \qquad (5)$$

where s is the column index (in the summation array) and $h_s$ is the total number of bits in column s (i.e. the array height for column s).

Referring to the example shown in FIG. 8 and for an allocated error $e_i$=32, $h_0$=4, $h_1$=7, $h_2$=10. So if r=2, $\sum_{s=0}^{r-1} h_s 2^s = (4\times1)+(7\times2)=18$ and if r=3, $\sum_{s=0}^{r-1} h_s 2^s = (4\times1)+(7\times2)+(10\times4)=58$ (which is greater than 32). Consequently, using equation (5), k=2 and two full columns of bits can be removed (in block 706) as shown in the diagram 804.

The number of bits, $l_k$, to remove from the next least significant column (i.e. the column with index k) is then calculated (in block 708) using:

$$l_k = \left\lceil (2^{-k}e_i) - 1 - \sum_{s=0}^{k-1} h_s 2^{s-k} \right\rceil \qquad (6)$$

Referring to the example shown in FIG. 8 and for an allocated error $e_i$=32, k=2 from above and so $l_k=[(2^{-2}\times32)-1-(4\times2^{-2}+7\times2^{-1})]=[8-1-1-3.5]=[2.5]3$. The calculated number of bits is then removed from column k (block 710) and this is shown in the diagram 804 in FIG. 8.

To compensate for the bits that have been removed (in blocks 706 and 710) a constant C is then added to the summation array (block 712) where:

$$C = e_i - 1$$

Having optimized each node (in block 306), e.g. using FRator as described above, equation (3) can be used iteratively (in block 310) to improve those starting errors by solving equations (4a) and (4b) above for $e_i$ for some constant T. The values of $$\frac{\partial R_i}{\partial e_j}$$

for all i and j are computed, where this is the rate of change of the number of partial product bits removed with respect to the error (for the newly optimized summation array generated in block 306), and while the following are not equal for all j:

$$\left\{ \frac{1}{\sum_i \frac{\partial R_i}{\partial e_j}} \sum_\alpha \lambda_\alpha \frac{\partial e^\alpha}{\partial e_j} \right\} \qquad (6a)$$

Replace e by f (where f is a vector of updated error allocations for each node) where f satisfies, for some constant T:

$$f_j \sum_\alpha \lambda_\alpha \frac{\partial f^\alpha}{\partial f_j} = T e_j \sum_i \frac{\partial R_i}{\partial e_j} \text{ for all } j \qquad (7a)$$

$$\sum_\alpha \lambda_\alpha f^\alpha = \eta \quad (7b)$$

which may alternatively be written as:

$$e_j \sum_i \frac{\partial R_i}{\partial e_j} \propto f_j \frac{\partial q}{\partial f_j} \quad (7a')$$

$$q(\lambda, f) = \eta \quad (7b')$$

The new allocated error values (now equal to f) are then used to further optimize each node (in block 306), e.g. using FRator as described above. This iterative process moves the variables $e_i$ towards a point at which equation (3) is satisfied.

The method shown in FIG. 3 and described above can be further explained with reference to three examples. The first is a cubic polynomial, the second is a bilinear interpolation (which requires constant division) and the third is an instance of a Gabor filter (which unlike the first two examples, is non linear in the $\varepsilon_i$ variables).

Figure 9:
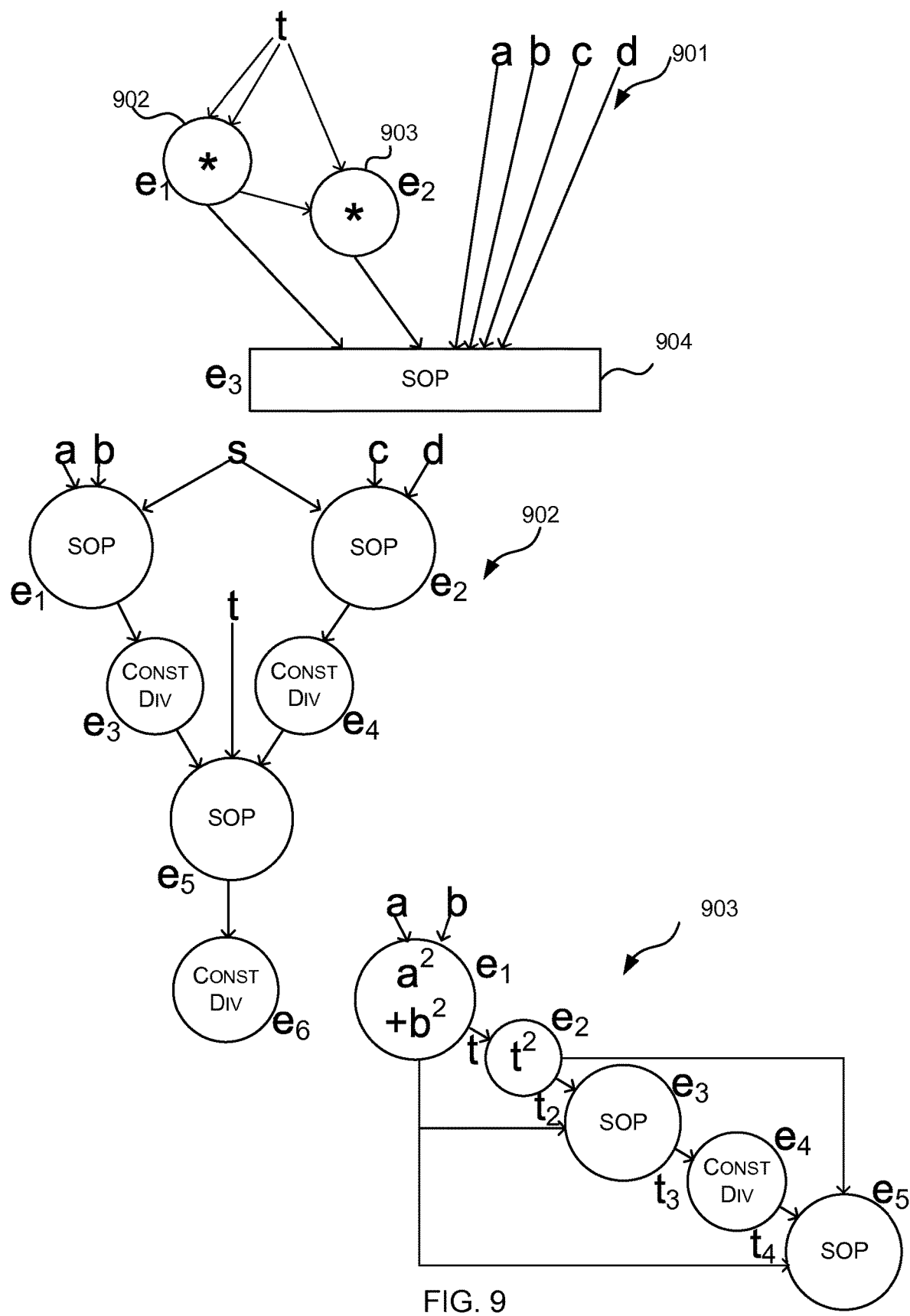
FIG. 9 shows three more example data-flow graphs.

In the first example, the polynomial is:

$$p = at^3 + 2^n bt^2 + 2^{2n} ct + 2^{3n} d$$

where t is an n-bit unsigned integer which may be represented as the DFG 901 shown in FIG. 9. If the whole polynomial must be computed to give a faithfully rounded result, the globally acceptable error is:

$$\eta = 2^{3n} - 1$$

Errors can be introduced into each of the three operators 902-904 shown in the DFG (with the maximum absolute allowable error for node i denoted $e_i$) and if the actual error introduced at each node is denoted $\varepsilon_1, \varepsilon_2, \varepsilon_3$, the value returned for the polynomial with these errors $\hat{p}$ is:

$$\hat{p} = a((t^2 + \varepsilon_1) t + \varepsilon_2) + 2^n b(t^2 + \varepsilon_1) + 2^{2n} ct + 2^{3n} d + \varepsilon_3$$

The globally acceptable error requires that:

$$|p - \hat{p}| \le \eta$$

and therefore:

$$|(at + 2^n b)\varepsilon_1 + a\varepsilon_2 + \varepsilon_3| \le 2^{3n} - 1$$

which is linear in variables $\varepsilon_i$.

As a result of the linearity, the initial errors may be set (in block 304) to:

$$e_i = \eta/(\lambda_i n)$$

where n is the number of operators (n=3 in this example) and the $\lambda_i$ terms are the maximum absolute values of the coefficient at each operator, so in this example:

$$\lambda_1 = \max|at + 2^n b| = (2^n - 1)(2^{n+1} - 1)$$

$$\lambda_2 = \max|a| = (2^n - 1)$$

$$\lambda_3 = 1$$

These errors are then used to optimize each node (in block 306), e.g. using FRator as described above. This involves array truncations, a constant addition and removal of the least significant k columns plus $l_k$ bits from column k. The updated error allocations are then calculated (in block 310) by computing $$\frac{\partial R_i}{\partial e_j}$$

for all i and j and while the following are not equal for all j:

$$\left\{ \frac{\lambda_j}{\sum_i \frac{\partial R_i}{\partial e_j}} \right\}$$

replacing e by f where f satisfies:

$$f_j = \frac{\eta e_j \sum_i \frac{\partial R_i}{\partial e_j}}{\lambda_j \sum_{i,j} e_j \frac{\partial R_i}{\partial e_j}} \quad (8)$$

The values $$\frac{\partial R_i}{\partial e_j}$$

can be computed by considering the extra amount of error required at node j to remove another partial product bit from the single array for another node i. If, as described above, the truncation removes k columns from the array, then removing another bit would require increasing the total value of all the removed bits by $2^k$ and for the bound still to be satisfied, e must be increased by $2^{k-1}$. So a value for $$\frac{\partial R_i}{\partial e_j}$$

is:

$$\frac{\partial R_i}{\partial e_j} = \begin{cases} \frac{1}{2^{k_i - 1}}, & j = i \\ 0, & \text{otherwise} \end{cases} \quad (9)$$

where $k_i$ is the number of truncated columns in the ith operator.

Based on the algorithm held within equation (8) above in light of this, the method shown in FIG. 3 can be simplified as follows whenever $\hat{p}$ is linear in the variables $\varepsilon_i$ and the DFG only consists of SOPs. The initially allocated errors are set (in block 304) to:

$$e_i = \eta/(\lambda_i n)$$

where n is he number of operators. The optimization within each node (in block 306) comprises computing the number of truncated columns $k_i$ (which, as described above, results in exploiting error $e_i$ in node l operator i) and then, while the following are not equal for all i:

$$\{\lambda_i 2^{k_i}\}$$

the error allocations are updated (in block 310) by replacing $e_j$ by the following:

$$\frac{\eta e_j 2^{-k_j}}{\lambda_j \sum_i e_i 2^{-k_i}}$$

In the second example, the polynomial is:

$$p = \left(1 - \frac{t}{2^n - 1}\right)\left(1 - \frac{s}{2^n - 1}\right)a + \left(1 - \frac{t}{2^n - 1}\right)\frac{s}{2^n - 1}b +$$
$$\frac{t}{2^n - 1}\left(1 - \frac{s}{2^n - 1}\right)c + \frac{t}{2^n - 1}\frac{s}{2^n - 1}d = \frac{\bar{t}\bar{s}a + \bar{t}sb + t\bar{s}c + tsd}{(2^n - 1)^2}$$

where $\bar{t}$ is the bit wise inversion of t and the absolute error bound, $\eta=1$. An example architecture that may be used is interpolation with respect to s followed by t:

$$s_{a,b} = \frac{\bar{s}a + sb}{2^n - 1}$$
$$s_{c,d} = \frac{\bar{s}c + sd}{2^n - 1}$$
$$p = \frac{\bar{t}s_{a,b} + ts_{a,b}}{2^n - 1}$$

The corresponding DFG is shown in the second example 902 in FIG. 9 which comprises 6 operators and hence has 6 potential locations for errors to be introduced. As above the maximum absolute allowable error at a node 1 operator is denoted $e_i$ and if the actual error at each node is denoted $\varepsilon_i$.

The implementation therefore returns the following value:

$$\hat{s}_{a,b} = \frac{\bar{s}a + sb + \varepsilon_1}{2^n - 1} + \varepsilon_3$$
$$\hat{s}_{c,d} = \frac{\bar{s}c + sd + \varepsilon_2}{2^n - 1} + \varepsilon_4$$
$$\hat{p} = \frac{\bar{t}\hat{s}_{a,b} + t\hat{s}_{a,b} + \varepsilon_5}{2^n - 1} + \varepsilon_6$$

This design also has $\hat{p}$ which is linear in the variables $\varepsilon_i$ which means that the linear version of the algorithm held within equation (8) above is still appropriate, but unlike the first example, this example exploits the error freedom in constant division.

The initially allocated errors are set (in block 304) to:

$$e_i = \eta/(\lambda_i n)$$

where n is he number of operators (6 in this example) and:

$$\lambda_1 = \max\left|\frac{\partial \hat{p}}{\partial \varepsilon_1}\right| = \max\left|\frac{\bar{t}}{(2^n - 1)^2}\right| = \frac{1}{2^{n-1}}$$
$$\lambda_2 = \max\left|\frac{\partial \hat{p}}{\partial \varepsilon_2}\right| = \max\left|\frac{t}{(2^n - 1)^2}\right| = \frac{1}{2^n - 1}$$
$$\lambda_3 = \max\left|\frac{\partial \hat{p}}{\partial \varepsilon_3}\right| = \max\left|\frac{\bar{t}}{2^n - 1}\right| = 1$$
$$\lambda_4 = \max\left|\frac{\partial \hat{p}}{\partial \varepsilon_4}\right| = \max\left|\frac{\bar{t}}{2^n - 1}\right| = 1$$

$$\lambda_5 = \max\left|\frac{\partial \hat{p}}{\partial \varepsilon_5}\right| = \max\left|\frac{1}{2^n - 1}\right| = 1$$
$$\lambda_6 = \max\left|\frac{\partial \hat{p}}{\partial \varepsilon_6}\right| = 1$$

So:

$$e_1 = e_2 = e_5 = \frac{2^n - 1}{6}$$
$$e_3 = e_4 = e_6 = \frac{1}{6}$$

As set out above, optimizing an SOP node comprises calculating the value of k and then this is used when updating error allocations to calculate a value for $$\frac{\partial R_i}{\partial e_j}$$

using in equation (9). This, however, cannot be used for constant division nodes.

It has been shown that the constant division of unsigned m-bit number x by d can be implemented as (ax+b)>>k, where '>>k' denotes a right binary shift by variable k. For a faithfully rounded scheme, the optimal value of k is defined as follows:

$$k_{opt} = \min(k^+, k^-) \quad (10a)$$

$$k^{\pm} = \min\left(k: \frac{2^k}{(\mp 2^k) \bmod d} \geq \left\lfloor \frac{2^m}{d} \right\rfloor\right) \quad (10b)$$

Allowable error introduced into the constant division is via dividing x by $2^r$ for some r<0. The value of k must then satisfy:

$$k^{\pm} = \min\left(k: \frac{2^k}{(\mp 2^k) \bmod d} > \left\lfloor \frac{2^{m-r}}{d} \right\rfloor\right)$$

If the error is doubled then r increases by one and $k_{opt}$ will change if one of the following $\mp$ conditions holds:

$$\frac{2^{k_{opt}-1}}{(\mp 2^{k_{opt}-1}) \bmod d} > \left\lfloor \frac{2^{m-r-1}}{d} \right\rfloor$$

If this condition holds, k would be decreased which will remove one partial product row from the product ax, removing m bits. Whether or not this condition is satisfied, the output of the constant divisor has been reduced by 1 bit. If the result of the constant divisor is subsequently used in another operator, further partial product bits will be removed.

If $n_{i,j}$ denotes the bit width of the variable that the output of operator i is multiplied by in operator j, and if operator i is a constant division operator with input bit width $n_{q,i}$ for some q, the constant for division is $d_i$, $k_{opt}$ for the operator is $k_i$, then:

$$\frac{\partial R_i}{\partial e_j} = \begin{cases} \frac{n_{q,i}}{2e_i} & j = i \text{ and } cond \text{ holds} \\ 0 & j = i \text{ and } cond \text{ does not hold} \\ \frac{n_{i,j}}{2e_i} & \text{otherwise} \end{cases} \quad (11)$$

$$cond = \left(\frac{2^{k_i-1}}{(\mp 2^{k_i-1}) \bmod d_i} > \left\lfloor \frac{2^{n_{q,i}-r_i-1}}{d_i} \right\rfloor\right)$$

where $e_i = u_i 2^{r_i}$ and $u_i \varepsilon [1,2)$.

Based on the algorithm held within equation (8) above in light of this, the method shown in FIG. 3 can be simplified as follows whenever $\hat{p}$ is linear in the variables $\varepsilon_i$ and the DFG consists of SOPs and constant divisions. The initially allocated errors are set (in block 304) to:

$$e_i = \eta/(\lambda_i n)$$

where n is he number of operators. The optimization within each node (in block 306) comprises, for SOPs, computing the number of truncated columns $k_i$ (which, as described above, results in exploiting error $e_i$ in node i) and for constant divisors, computing the constant shift value $k_i$ (which, as described above, results in exploiting error $e_i$ in node i). Then, while the following are not equal for all i:

$$\left\{ \frac{\lambda_j}{\sum_i \frac{\partial R_i}{\partial e_j}} \right\}$$

the error allocations are updated (in block 310) by replacing $e_j$ by the following:

$$\frac{\eta e_j \sum_i \frac{\partial R_i}{\partial e_j}}{\lambda_j \sum_{i,j} e_j \frac{\partial R_i}{\partial e_j}}$$

where the values for $$\frac{\partial R_i}{\partial e_j}$$

are calculated using equation (9) for SOP or nodes and equation (11) for constant division nodes.

In the third example, $\hat{p}$ which is non linear in the variables $\varepsilon_i$, for example when implementing an instance of a Gabor filter. The DFG for the architecture is shown in the third example 903 in FIG. 9 and comprises 5 operators (and hence has 5 potential locations for errors to be introduced). In this example, the polynomial equations can be solved via Grobner bases techniques.

Figure 10:
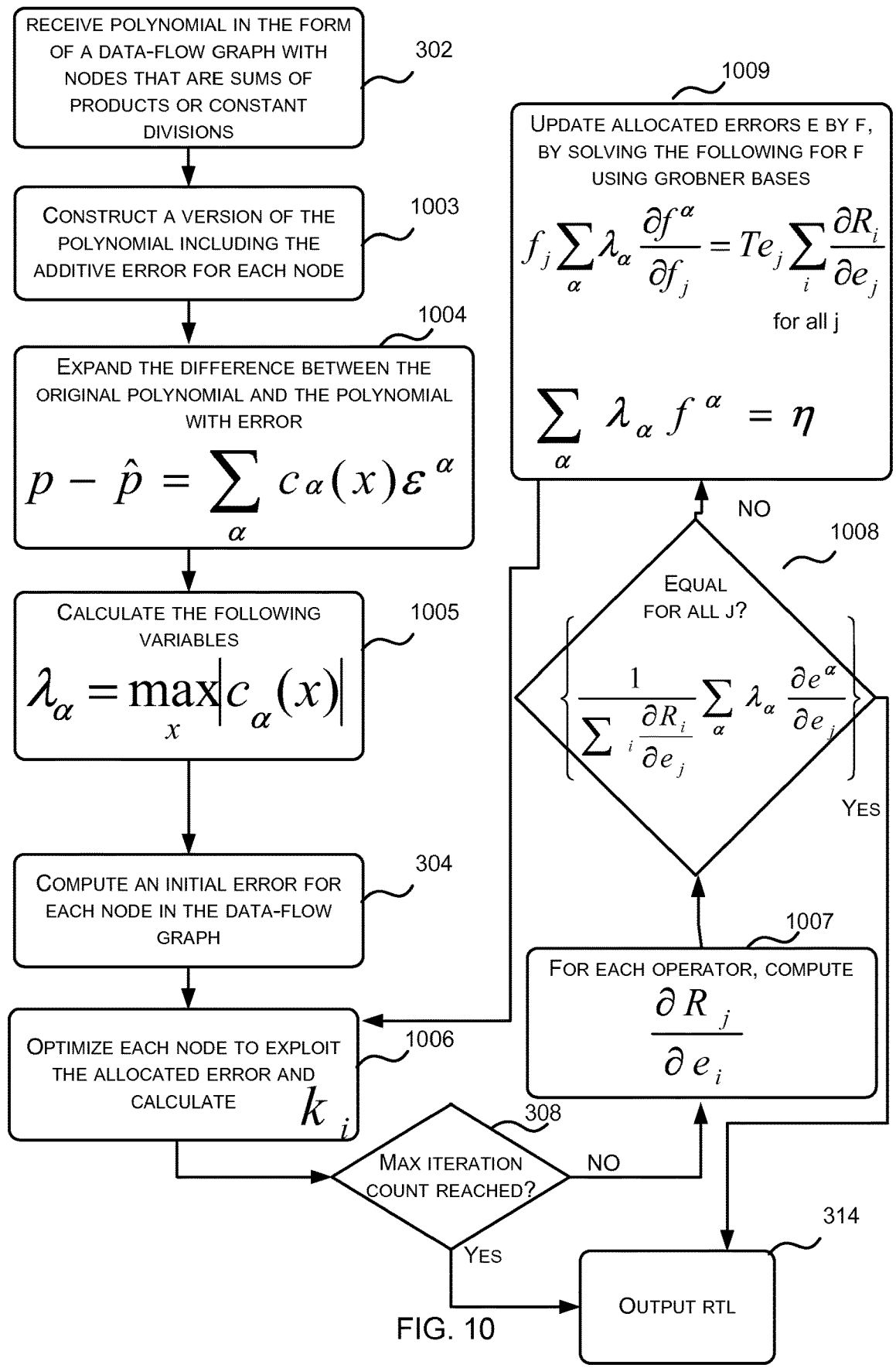
FIG. 10 is a flow diagram of another example method of operation of the lossy synthesizer shown in FIG. 2.

FIG. 10 shows a more detailed implementation of the method shown in FIG. 3 for a polynomial p. The method comprises receiving (by the lossy synthesizer) a DFG representing the polynomial p (block 302). The DFG which is received (in block 302) has an architecture consisting only of operations which are SOPs or constant divisions. A version of the polynomial (denoted $\hat{p}$) is then constructed which has an additive error $\varepsilon_i$ for each operator (block 1003).

The difference between the original polynomial p and the polynomial with error $\hat{p}$ is then expanded with respect to the variables $\varepsilon_i$ (block 1004) to produce an expansion of the form:

$$p - \hat{p} = \sum_\alpha c_\alpha(x) \varepsilon^\alpha$$

The variables $\lambda_\alpha$ are then calculated (block 1005), where these are defined as follows:

$$\lambda_\alpha = \max_x |c_\alpha(x)|$$

These may, for example, be calculated by iterative use of Satisfiability Modulo Theory (SMT).

An initial error for each operator (i.e. each node in the DFG is calculated (block 304). These initial errors, $e_i$ the starting maximum error bound for each operator, can be provided by the user or they may be determined by solving the following equations via Grobner bases which includes the maximum absolute error tolerance defined by the user $\eta$:

$$\sum_\alpha \lambda_\alpha e_j \frac{\partial e^\alpha}{\partial e_j} = T \text{ for all } j \quad (4a)$$

$$\sum_\alpha \lambda_\alpha e^\alpha = \eta \quad (4b)$$

Each operator is then optimized to exploit the allocated error $e_i$ (which is referred to as the maximum absolute allowable error for the operator) and to calculate a value $k_i$ (block 1006). How this is done is different depending upon whether the operator is a SOP or constant division operator. For an SOP operator, a single partial product array is created and using the FRator technique described above (i.e. equation (5)) the value of $k_i$ is calculated:

$$k = \max(r) \text{ such that } \sum_{s=0}^{r-1} h_s 2^s < e_i \quad (5)$$

For a constant division operator which requires the division by d, the value of $k_i$ is calculated using equations (10a) and (10b) from above.

$$k_{opt} = \min(k^+, k^-) \quad (10a)$$

$$k^\pm = \min\left(k : \frac{2^k}{(\mp 2^k) \bmod d} > \left\lfloor \frac{2^m}{d} \right\rfloor\right) \quad (10b)$$

The rate of change in the number of partial product bits with changing error, $$\frac{\partial R_j}{\partial e_i},$$

is then calculated for each operator j. For an SOP operator this uses equation (9) above:

$$\frac{\partial R_j}{\partial e_i} = \begin{cases} \frac{1}{2^{k_j-1}}, & j=i \\ 0, & \text{otherwise} \end{cases} \quad (9)$$

and for a constant division operator, equation (11) is used:

$$\frac{\partial R_j}{\partial e_i} = \begin{cases} \frac{n_{q,i}}{2e_i} & j=i \text{ and } cond \text{ holds} \\ 0 & j=i \text{ and } cond \text{ does not hold} \\ \frac{n_{i,j}}{2e_i} & \text{otherwise} \end{cases} \quad (11)$$

$$cond = \left( \frac{2^{k_i-1}}{(\mp 2^{k_i-1}) \bmod d_i} > \left\lfloor \frac{2^{n_{q,i}-r_i-1}}{d_i} \right\rfloor \right)$$

where $n_{q,i}$ is the input bit width into the operator and $e_i = u_i 2^{r_i}$ and $u_i \varepsilon [1,2)$. The input bit widths are recalculated at each iteration for all nodes in the DFG (e.g. as part of the optimization process of block 1006) as they affect both the constant division operators (as in equation (11)) and SOP operators (where the bit widths affect the number of bits per column in the array).

The method is iterated for a maximum number of iterations (until block 308 returns 'Yes') or maximum runtime or until the following are equal for all j ('Yes' in block 1008):

$$\left\{ \frac{1}{\sum_i \frac{\partial R_i}{\partial e_j}} \sum_\alpha \lambda_\alpha \frac{\partial e^\alpha}{\partial e_j} \right\} \quad (6a)$$

The condition expressed in equation (6a) above (and block 1008 in FIG. 10) is the same as the condition described above with reference to block 312 in FIG. 3. In the event that the method terminates at a maximum number of iterations ('Yes' in block 308) or maximum runtime, the iteration that has the small range of values according to equation (6a) may be returned.

If the method does not terminate at block 1008 (i.e. the values of equation (6a) are not equal for all j), the allocated errors for each operator are updated by replacing the current error allocations, e, with updated error allocations f, by solving the following equations using Grobner bases (block 1009):

$$f_j \sum_\alpha \lambda_\alpha \frac{\partial f^\alpha}{\partial f_j} = Te_j \sum_i \frac{\partial R_i}{\partial e_j} \text{ for all } j \quad (7a)$$

$$\sum_\alpha \lambda_\alpha f^\alpha = \eta \quad (7b)$$

which may alternatively be written as:

$$e_j \sum_i \frac{\partial R_i}{\partial e_j} \propto f_j \frac{\partial q}{\partial f_j} \quad (7a')$$

$$q(\lambda, f) = \eta \quad (7b')$$

This procedure requires array creation for the SOP operators and may be implemented where the operators can be implemented via the summation of any binary array.

By using the methods described above (e.g. as shown in FIGS. 3 and 10), a hardware logic design (e.g. in RTL) can be generated which occupies a smaller area when fabricated (e.g. a smaller area of silicon) but still guarantees to meet a defined error requirement (which may be faithful rounding of the result of the entire polynomial). This aids miniaturization of components and the devices (e.g. smartphones, tablet computers and other computing devices) in which the components are used. In addition, or instead, it enables more functionality to be implemented within a similar area of silicon chip. By reducing the physical size (i.e. area) that is used, more ICs can be fabricated from a single silicon wafer, which reduces the overall cost per die.

In the methods described above (and shown in FIGS. 3 and 10), the polynomial is represented as a DFG comprising only SOPs and constant divisions and input to the lossy synthesizer (in block 302) and initial errors are allocated to each node (i.e. operator) in the DFG (in block 304). It will be appreciated that there may be many different architectures which could be used for a particular polynomial and many different ways that the initial errors could be allocated to nodes (when implementing block 304). These different architectures and/or error allocations may lead to different RTL implementations for a polynomial being generated.

In various examples, more than one RTL implementation for a polynomial may be generated (e.g. a first RTL implementation using the initially allocated errors and a second RTL implementation using the final updated allocated errors) and the resulting RTL implementations may be compared using a heuristic hardware cost function given below which uses a unit area cost model for AND and OR gates and a unit area cost of two for XOR gates. An example of such a cost function for an arbitrary binary array, with width w, height h and a number pp of bits in the array, has the form:

$$\text{area (array}(h, w, pp)) \approx 7pp\left(1 - \left(\frac{2}{3}\right)^f\right) + \frac{w}{2}(2\lceil \log_2 w \rceil + 11)$$

$$\text{where } f = \left\lceil \frac{\log_2 h - 1}{\log_2 3 - 1} \right\rceil$$

By using this cost function, several candidate RTL implementations may be compared and one may be selected to be input to a logic synthesizer to transition the RTL implementation into a gate level description which can then be laid out and implemented in silicon. This is a more efficient process than having to perform the logic synthesis and layout of each of the candidate RTL implementations to determine which is most efficient in terms of area requirements (i.e. which implementation requires the least area of hardware logic).

Although the cost function above is described with reference to lossy synthesis, the cost function allows for the costing of any array summation and can be applied in other applications beyond lossy synthesis.

Figure 11:
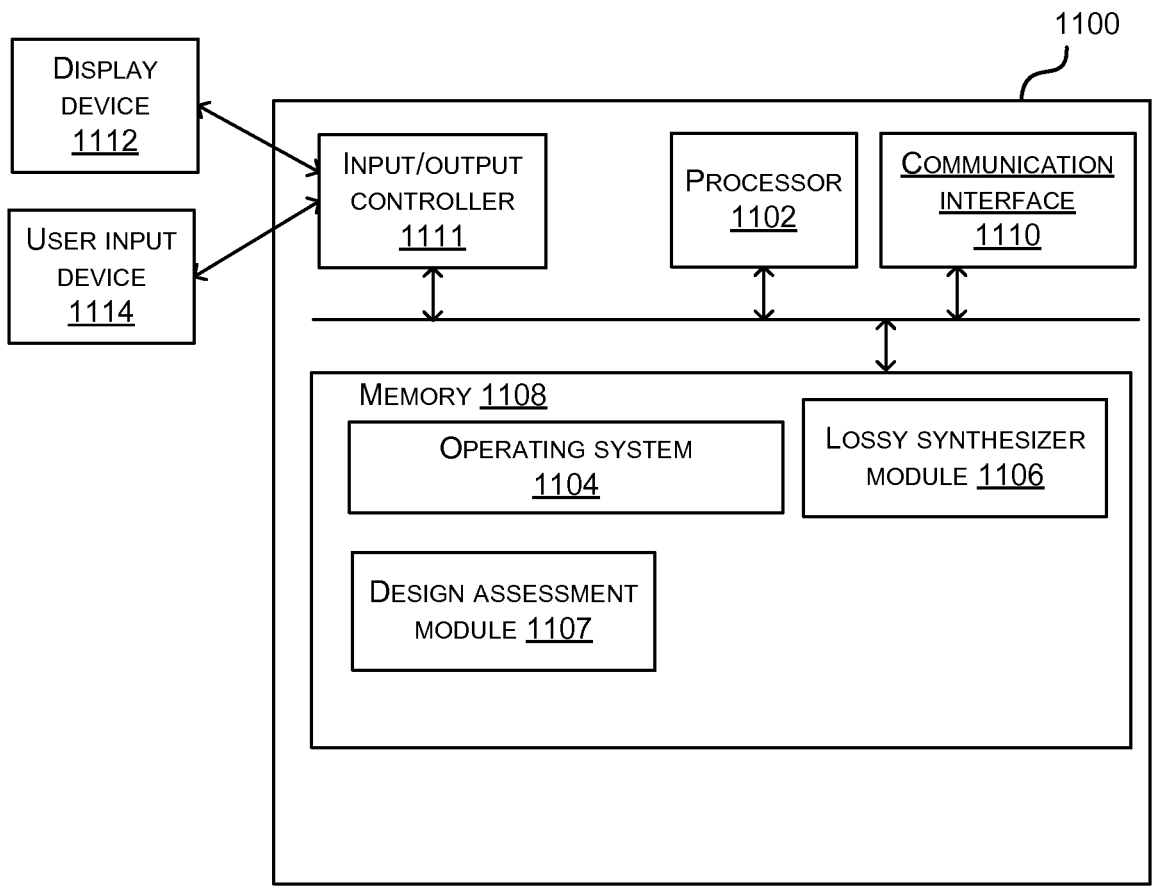
FIG. 11 is a schematic diagram of an example computing device which may be configured to implement the methods described herein.

FIG. 11 illustrates various components of an exemplary computing-based device 1100 which may be implemented as any form of a computing and/or electronic device, and in which embodiments of the methods described herein may be implemented.

Computing-based device 1100 comprises one or more processors 1102 which may be microprocessors, controllers or any other suitable type of processors for processing computer executable instructions to control the operation of the device in order to perform the methods described herein (e.g. the method of FIG. 3 or FIG. 10). In some examples, for example where a system on a chip architecture is used, the processors 1102 may include one or more fixed function blocks (also referred to as accelerators) which implement a part of the method of generating RTL for a polynomial in hardware (rather than software or firmware). Platform software comprising an operating system 1104 or any other suitable platform software may be provided at the computing-based device to enable application software, such as a lossy synthesizer module 1106 (which performs the method of FIG. 3 or FIG. 10) and/or a design assessment module 1107 (which implements the cost function above) to be executed on the device.

The computer executable instructions may be provided using any computer-readable media that is accessible by computing based device 1100. Computer-readable media may include, for example, computer storage media such as memory 1108 and communications media. Computer storage media (i.e. non-transitory machine readable media), such as memory 1108, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 1108) is shown within the computing-based device 1100 it will be appreciated that the storage may be distributed or located remotely and accessed via a network or other communication link (e.g. using communication interface 1110).

The computing-based device 1100 also comprises an input/output controller 1111 arranged to output display information to a display device 1112 which may be separate from or integral to the computing-based device 1100. The display information may provide a graphical user interface. The input/output controller 1111 is also arranged to receive and process input from one or more devices, such as a user input device 1114 (e.g. a mouse or a keyboard). This user input may be used to specify maximum error bounds (e.g. for use in the method of FIG. 3 or 10) or to select one of a plurality of candidate hardware logic designs based on the output of the design assessment module 1107. In an embodiment the display device 1112 may also act as the user input device 1114 if it is a touch sensitive display device. The input/output controller 1111 may also output data to devices other than the display device, e.g. a locally connected printing device (not shown in FIG. 11).

The term 'processor' and 'computer' are used herein to refer to any device, or portion thereof, with processing capability such that it can execute instructions. The term 'processor' may, for example, include central processing units (CPUs), graphics processing units (GPUs or VPUs), physics processing units (PPUs), radio processing units (RPUs), digital signal processors (DSPs), general purpose processors (e.g. a general purpose GPU), microprocessors, any processing unit which is designed to accelerate tasks outside of a CPU, etc. Those skilled in the art will realize that such processing capabilities are incorporated into many different devices and therefore the term 'computer' includes set top boxes, media players, digital radios, PCs, servers, mobile telephones, personal digital assistants and many other devices.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A method of generating an implementation of a fixed-point polynomial with rational coefficients in hardware logic that satisfies a defined error bound, the method comprising:
   receiving, in a synthesizer module, the polynomial as a data-flow graph comprising one or more nodes, wherein each node is either a sum-of-products operator or a constant division operator;
   computing, in the synthesizer module, an error bound for each node in the data-flow graph based on the defined error bound for the polynomial;
   optimizing, in the synthesizer module, a single summation array for each node using a truncation scheme and the error bound for each node;
   calculating, in the synthesizer module, an updated error bound for each node in the data-flow graph, wherein the calculating of updated error bounds redistributes error bounds between nodes to allow for synthesis of the fixed-point polynomial with a reduced physical size whilst satisfying the defined error bound; and
   further optimizing, in the synthesizer module, the single summation array for each node using the truncation scheme and the updated error bound for the node; and
   generating the implementation of the fixed-point polynomial in hardware logic using the optimized single summation arrays.

2. The method according to claim 1, further comprising:
   inputting RTL generated by the method of claim 1 to a logic synthesizer to produce a gate level description of the implementation of the fixed-point polynomial.

3. The method according to claim 1, further comprising:
   fabricating the implementation of the fixed-point polynomial in silicon.

4. The method according to claim 1, further comprising repeating:
   calculating, in the synthesizer module, an updated error bound for each node in the data-flow graph; and
   further optimizing, in the synthesizer module, the single summation array for each node using the truncation scheme and the updated error bound for the node, until a stop condition is reached, the stop condition comprising one of:
   a maximum iteration count is reached;
   a maximum runtime is reached; and
   the updated error bound for each node calculated in an iteration is the same as the updated error bound for each node calculated in an immediately previous iteration, wherein the single summation array which is optimized in an iteration is the single summation array generated, in the synthesizer module, by the optimization in the immediately previous iteration.

5. The method according to claim 1, wherein optimizing a single summation array for each node using a truncation scheme and the error bound for the node comprises:
   calculating, in the synthesizer module, a parameter k for each node, wherein:
   for a node which is a sum-of-products operator, the parameter k is a number of whole columns in the single summation array that can be removed whilst satisfying the error bound for the node; and
   for a node which is a constant division operator, the parameter k is a number of bits by which an output from the node is right shifted when the constant division operation is implemented as a sum-of-products operation followed by a right shift by k bits.

6. The method according to claim 5, wherein optimizing a single summation array for each node using a truncation scheme and the error bound for the node further comprises:
   calculating, in the synthesizer module, an updated input bit width for each node.

7. The method according to claim 5, wherein calculating an updated error bound for each node in the data-flow graph comprises:
   calculating, in the synthesizer module, for each node, a rate of change of a number of bits removed from the single summation array for node with respect to a change in error bound for the node.

8. The method according to claim 7, wherein the fixed-point polynomial is linear with respect to actual errors introduced by each node and wherein the rate of change of a number of bits removed from the single summation array for node j with respect to a change in error bound for the node, $$\frac{\partial R_j}{\partial e_i},$$

comprises:
for a node j which is a sum-of-products operator:

$$\frac{\partial R_j}{\partial e_i} = \begin{cases} \frac{1}{2^{k_j-1}}, & j = i \\ 0, & \text{otherwise} \end{cases}$$

where $k_j$ is the parameter k for the node; and
for a node j which is a constant division operator:

$$\frac{\partial R_j}{\partial e_i} = \begin{cases} \frac{n_{q,i}}{2e_i} & j = i \text{ and } cond \text{ holds} \\ 0 & j = i \text{ and } cond \text{ does not hold} \\ \frac{n_{i,j}}{2e_i} & \text{otherwise} \end{cases}$$

-continued $$cond = \left(\frac{2^{k_i-1}}{(\mp 2^{k_i-1}) \bmod d_i} > \left\lfloor \frac{2^{n_{q,i}-r_i-1}}{d_i} \right\rfloor\right)$$

where $n_{q,i}$ is an input bit width into the node, $e_i$ is the error bound for node i and $e_i = u_i 2^{r_i}$ and $u_i \epsilon [1,2)$.

9. The method according to claim 5, wherein the fixed-point polynomial is linear with respect to actual errors introduced by each node and wherein computing an error bound for each node in the data-flow graph based on the defined error bound for the polynomial comprises:
 setting, in the synthesizer module, an error for a node i to a value $e_i$ where $e_i = \eta/(\lambda_i n)$, $\eta$ is the defined error bound for the polynomial and $\lambda_i$ is a maximum absolute value of a coefficient at node i.

10. The method according to claim 9, wherein calculating an updated error bound for each node in the data-flow graph comprises updating, in the synthesizer module, a value $e_i$ at node i to a value given by:

$$\frac{\eta e_j \sum_i \frac{\partial R_i}{\partial e_j}}{\lambda_j \sum_{i,j} e_j \frac{\partial R_i}{\partial e_j}}$$

where $R_i$ is a number of bits removed from the single summation array at node i when optimizing node i using a truncation scheme and the error bound $e_i$ for the node i, $\lambda_j$ is a maximum absolute value of a coefficient at node j and $e_j$ is the error bound for the node j.

11. The method according to claim 5, wherein the fixed-point polynomial is non-linear with respect to actual errors introduced by each node and wherein computing an error bound for each node in the data-flow graph based on the defined error bound for the polynomial comprises solving, in the synthesizer module, the following equations via Grobner bases:

$$\sum_\alpha \lambda_\alpha e_j \frac{\partial e^\alpha}{\partial e_j} = T \text{ for all } j$$

$$\sum_\alpha \lambda_\alpha e^\alpha = \eta$$

wherein T is a constant, $\lambda_\alpha = \max_x |c_\alpha(x)|$ and $e^\alpha$ is an error bound term associated with $c_\alpha(x)$.

12. The method according to claim 11, wherein calculating an updated error bound for each node in the data-flow graph comprises updating a value $e_j$ at node j to a value $f_j$ given by solving, in the synthesizer module, the following equations using Grobner bases:

$$f_j \sum_\alpha \lambda_\alpha \frac{\partial f^\alpha}{\partial f_j} = T e_j \sum_i \frac{\partial R_i}{\partial e_j} \text{ for all } j$$

$$\sum_\alpha \lambda_\alpha f^\alpha = \eta.$$

13. The method according to claim 1, further comprising: generating, in the synthesizer module, a second implementation of the fixed-point polynomial with rational coefficients in hardware logic that satisfies the defined error bounding using the method according to claim 1; and
 using, in a design assessment module, a heuristic hardware cost function to compare the implementations.

14. The method according to claim 13, further comprising:
 in response to the comparison, selecting, in the design assessment module, one of the implementations in hardware logic; and
 inputting RTL for the selected implementation to a logic synthesizer to produce a gate level description of the implementation of the fixed-point polynomial.

15. The method according to claim 14, further comprising:
 fabricating the selected implementation of the fixed-point polynomial in silicon.

16. The method according to claim 13, wherein the heuristic hardware cost function for an arbitrary binary array, with width w, height h and a number pp of bits in the array is given by:

$$\text{area (array}(h, w, pp)) \approx 7pp\left(1 - \left(\frac{2}{3}\right)^f\right) + \frac{w}{2}(3\lceil \log_2 w \rceil + 11)$$

where $f = \left\lceil \frac{\log_2 h - 1}{\log_2 3 - 1} \right\rceil$.

17. An apparatus configured to perform lossy synthesis of a fixed-point polynomial with rational coefficients and generate an implementation of the fixed-point polynomial in RTL, the apparatus comprising:
 a processor; and
 a memory comprising computer executable instructions which, when executed, cause the processor to:
 receive the polynomial as a data-flow graph comprising one or more nodes, wherein each node is either a sum-of-products operator or a constant division operator;
 compute an error bound for each node in the data-flow graph based on the defined error bound for the polynomial;
 optimize a single summation array for each node using a truncation scheme and the error bound for each node;
 calculate an updated error bound for each node in the data-flow graph, wherein the calculating of updated error bounds redistributes error bounds between nodes to allow for synthesis of the fixed-point polynomial with a reduced physical size whilst satisfying the defined error bound;
 further optimize the single summation array for each node using the truncation scheme and the updated error bound for the node; and
 generate the implementation of the fixed-point polynomial in hardware logic using the optimized single summation arrays.

18. An apparatus configured to compare two or more array summations when implemented in hardware logic, the apparatus comprising:
 a processor; and
 a memory comprising computer executable instructions which, when executed, cause the processor to:
 receive RTL data describing the two or more array summations; and
 calculating, for each array summation, a cost function using:

$$\text{area (array}(h, w, pp)) \approx 7pp\left(1 - \left(\frac{2}{3}\right)^f\right) + \frac{w}{2}(2\lceil \log_2 w \rceil + 11)$$

$$\text{where } f = \left\lceil \frac{\log_2 h - 1}{\log_2 3 - 1} \right\rceil \qquad\qquad 5$$

where w is a width of the array, h is a height of the array and pp is a number of bits in the array, wherein the cost functions calculated for each array summation provide for several candidate RTL implementations to be compared and an RTL implementation with an optimal cost function to be selected for implementation in hardware; and wherein a hardware logic implementation of the fixed-point polynomial is generated using the selected array summations.

19. The apparatus according to claim 18, wherein the memory further comprises computer executable instructions which, when executed, cause the processor to:
- select one of the array summations with a lowest value of the cost function; and
- input RTL for the selected array summation to a logic synthesizer to produce a gate level description of the array summation.

* * * * *

UNITED STATES PATENT AND TRADEMARK OFFICE
CERTIFICATE OF CORRECTION

PATENT NO. : 11,010,515 B2
APPLICATION NO. : 14/856393
DATED : May 18, 2021
INVENTOR(S) : Drane It is certified that error appears in the above-identified patent and that said Letters Patent is hereby corrected as shown below:

On the Title Page

In item (30) Foreign Application Priority Data:
"Oct. 1, 2014 (GB) .................. 1417393" should read as --Oct. 1, 2014 (GB) .................. 1417393.4--

In the Specification

Column 1, Lines 24-25, formula (2):
"$(v_1c_1+v_2c_2+v_3c_3)^2-(v_1^2+v_2^2+v_3^2)(c_2^1+c_2^2+c_3^2-r^2)\geq 0$" should read as $$--(v_1c_1 + v_2c_2 + v_3c_3)^2 - (v_1^2 + v_2^2 + v_3^2)(c_1^2 + c_2^2 + c_3^2 - r^2) \geq 0 --$$

Column 11, Lines 45-46:
"$|(at+2^n b)\epsilon_1+a\epsilon_2+\epsilon_3|\leq 2^{3n}-1$" should read as --$|(at + 2^n b)\varepsilon_1 + a\varepsilon_2 + \varepsilon_3| \leq 2^{3n} - 1$--

Column 13, Lines 65-66:
"$\lambda_4 = \max\left|\frac{\partial \hat{p}}{\partial \varepsilon_4}\right| = \max\left|\frac{\bar{t}}{2^n - 1}\right| = 1$" should read as --$\lambda_4 = \max\left|\frac{\partial \hat{p}}{\partial \varepsilon_4}\right| = \max\left|\frac{t}{2^n - 1}\right| = 1$--

Column 15, Line 11:
"$u_i\varepsilon[1,2]$." should read as --$u_i\epsilon[1,2]$.--

Column 17, Line 20:
"$u_i\varepsilon[1,2]$." should read as --$u_i\epsilon[1,2]$.--

Signed and Sealed this
Thirty-first Day of May, 2022

Katherine Kelly Vidal
*Director of the United States Patent and Trademark Office*

CERTIFICATE OF CORRECTION (continued)
U.S. Pat. No. 11,010,515 B2

Column 18, Lines 38-39:

"$\text{area (array}(h, w, pp)) \approx 7pp\left(1 - \left(\frac{2}{3}\right)^f\right) + \frac{w}{2}(2\lceil \log_2 w \rceil + 11)$" should read as -- $area\ (array\ (h, w, pp)) \approx 7pp\left(1 - \left(\frac{2}{3}\right)^f\right) + \frac{w}{2}(3\lceil log_2 w \rceil + 11)$ --

In the Claims

Column 25, Lines 1-2:

"$\text{area (array}(h, w, pp)) \approx 7pp\left(1 - \left(\frac{2}{3}\right)^f\right) + \frac{w}{2}(2\lceil \log_2 w \rceil + 11)$" should read as -- $area\ (array\ (h, w, pp)) \approx 7pp\left(1 - \left(\frac{2}{3}\right)^f\right) + \frac{w}{2}(3\lceil log_2 w \rceil + 11)$ --